United States Patent
Seddon et al.

(10) Patent No.: US 10,115,662 B2
(45) Date of Patent: Oct. 30, 2018

(54) SEMICONDUCTOR DEVICE AND METHOD OF FORMING A CURVED IMAGE SENSOR

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Mesa, AZ (US); Eric Woolsey, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/218,777

(22) Filed: Jul. 25, 2016

(65) Prior Publication Data
US 2017/0084661 A1    Mar. 23, 2017

Related U.S. Application Data

(60) Provisional application No. 62/219,666, filed on Sep. 17, 2015.

(51) Int. Cl.
*H01L 21/78* (2006.01)
*H01L 23/498* (2006.01)
(Continued)

(52) U.S. Cl.
CPC .. *H01L 23/49827* (2013.01); *H01L 21/02035* (2013.01); *H01L 21/288* (2013.01);
(Continued)

(58) Field of Classification Search
CPC .............. H01L 23/49827; H01L 21/78; H01L 23/49575; H01L 27/14683; H01L 23/49503; H01L 21/3083; H01L 21/304; H01L 23/49541; H01L 21/67063; H01L 22/26; H01L 21/02035; H01L 22/12; H01L 23/562; H01L 25/0657; H01L 23/3114; H01L 23/49562; H01L 21/3065;
(Continued)

(56) References Cited

U.S. PATENT DOCUMENTS

6,455,931 B1 * 9/2002 Hamilton, Jr. .... H01L 27/14601
                                                    250/332
6,627,865 B1 * 9/2003 Hamilton, Jr. ...... H01L 27/1446
                                                    250/208.1
(Continued)

*Primary Examiner* — Joshua King
(74) *Attorney, Agent, or Firm* — IPTechLaw (57) ABSTRACT

A semiconductor device has a semiconductor die containing a base material having a first surface and a second surface with an image sensor area. A masking layer with varying width openings is disposed over the first surface of the base material. The openings in the masking layer are larger in a center region of the semiconductor die and smaller toward edges of the semiconductor die. A portion of the first surface of the base material is removed by plasma etching to form a first curved surface. A metal layer is formed over the first curved surface of the base material. The semiconductor die is positioned over a substrate with the first curved surface oriented toward the substrate. Pressure and temperature is applied to assert movement of the base material to change orientation of the second surface with the image sensor area into a second curved surface.

20 Claims, 5 Drawing Sheets

(51) Int. Cl.
  H01L 21/48      (2006.01)
  H01L 21/3065    (2006.01)
  H01L 23/495     (2006.01)
  H01L 21/67      (2006.01)
  H01L 21/66      (2006.01)
  H01L 21/56      (2006.01)
  H01L 23/31      (2006.01)
  H02M 3/158      (2006.01)
  H01L 23/482     (2006.01)
  H01L 25/065     (2006.01)
  H01L 25/00      (2006.01)
  H01L 23/544     (2006.01)
  H01L 23/00      (2006.01)
  H01L 21/02      (2006.01)
  H01L 21/304     (2006.01)
  H01L 21/308     (2006.01)
  H01L 27/146     (2006.01)
  H01L 21/288     (2006.01)
  H01L 21/683     (2006.01)
  H01L 21/768     (2006.01)
  H01L 23/48      (2006.01)
  H01L 27/02      (2006.01)
  H01L 27/088     (2006.01)
  H01L 27/14      (2006.01)
  H01L 29/08      (2006.01)
  H01L 23/15      (2006.01)

(52) U.S. Cl.
  CPC .......... *H01L 21/304* (2013.01); *H01L 21/308* (2013.01); *H01L 21/3065* (2013.01); *H01L 21/3083* (2013.01); *H01L 21/486* (2013.01); *H01L 21/4825* (2013.01); *H01L 21/4853* (2013.01); *H01L 21/565* (2013.01); *H01L 21/67069* (2013.01); *H01L 21/6835* (2013.01); *H01L 21/76877* (2013.01); *H01L 21/76898* (2013.01); *H01L 21/78* (2013.01); *H01L 22/12* (2013.01); *H01L 22/26* (2013.01); *H01L 23/3107* (2013.01); *H01L 23/3114* (2013.01); *H01L 23/481* (2013.01); *H01L 23/4822* (2013.01); *H01L 23/4951* (2013.01); *H01L 23/49503* (2013.01); *H01L 23/49541* (2013.01); *H01L 23/49562* (2013.01); *H01L 23/49575* (2013.01); *H01L 23/49811* (2013.01); *H01L 23/49838* (2013.01); *H01L 23/49866* (2013.01); *H01L 23/544* (2013.01); *H01L 23/562* (2013.01); *H01L 24/05* (2013.01); *H01L 25/0655* (2013.01); *H01L 25/0657* (2013.01); *H01L 25/50* (2013.01); *H01L 27/0207* (2013.01); *H01L 27/088* (2013.01); *H01L 27/14* (2013.01); *H01L 27/14683* (2013.01); *H01L 29/0847* (2013.01); *H02M 3/158* (2013.01); *H01L 23/15* (2013.01); *H01L 23/49816* (2013.01); *H01L 27/14625* (2013.01); *H01L 27/14685* (2013.01); *H01L 2221/68327* (2013.01); *H01L 2223/5446* (2013.01); *H01L 2223/54426* (2013.01); *H01L 2224/0401* (2013.01); *H01L 2224/04042* (2013.01); *H01L 2224/05083* (2013.01); *H01L 2224/05084* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05172* (2013.01); *H01L 2224/05184* (2013.01); *H01L 2224/13025* (2013.01); *H01L 2224/13111* (2013.01); *H01L 2224/13116* (2013.01); *H01L 2224/48091* (2013.01); *H01L 2225/06555* (2013.01); *H01L 2225/06593* (2013.01); *H01L 2225/06596* (2013.01); *H01L 2924/13055* (2013.01); *H01L 2924/13091* (2013.01)

(58) Field of Classification Search
  CPC ... H01L 23/4951; H01L 24/05; H01L 23/544; H01L 23/3107; H01L 25/50; H01L 25/0655; H01L 23/4822; H01L 21/4825; H01L 21/565; H01L 21/4853; H01L 23/49838; H01L 21/486; H01L 23/49811; H01L 23/49866; H01L 2223/54426; H01L 2224/48091; H01L 2223/5446; H01L 2225/06593; H01L 2225/06555; H01L 2225/06596; H01L 27/14625; H01L 27/14685; H01L 2224/04042; H02M 3/158
  See application file for complete search history.

(56) References Cited

U.S. PATENT DOCUMENTS

| | | | |
|---|---|---|---|
| 6,828,545 B1* | 12/2004 | Hamilton, Jr. | H01L 27/1465 250/208.1 |
| 7,507,944 B1* | 3/2009 | Arnzen | H01L 27/14603 250/208.1 |
| 7,910,942 B2* | 3/2011 | Yoon | H01L 33/20 257/98 |
| 7,935,559 B1* | 5/2011 | Giffard | H01L 27/14683 257/E21.189 |
| 2009/0039370 A1* | 2/2009 | Han | H01L 33/20 257/98 |
| 2012/0261551 A1* | 10/2012 | Rogers | G02B 3/14 250/208.1 |
| 2013/0075587 A1* | 3/2013 | Suzuki | H01L 27/14618 250/208.1 |
| 2013/0075849 A1* | 3/2013 | Suzuki | H01L 27/14605 257/432 |
| 2013/0270662 A1* | 10/2013 | Roy | H01L 31/02 257/431 |
| 2014/0160327 A1 | 6/2014 | Enoki et al. | |
| 2016/0086987 A1* | 3/2016 | McKnight | H01L 27/14607 257/432 |
| 2016/0086994 A1* | 3/2016 | Guenter | H01L 27/14625 250/206 |

* cited by examiner

SEMICONDUCTOR DEVICE AND METHOD OF FORMING A CURVED IMAGE SENSOR

CLAIM TO DOMESTIC PRIORITY

The present application claims the benefit of U.S. Provisional Application No. 62/219,666, filed Sep. 17, 2015, entitled "SEMICONDUCTOR PACKAGES AND METHODS" invented by Francis J. CARNEY and Michael J. SEDDON, and which is incorporated herein by reference and priority thereto for common subject matter is hereby claimed.

FIELD OF THE INVENTION

The present invention relates in general to semiconductor devices and, more particularly, to a semiconductor device and method of forming a curved image sensor.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), standard logic, amplifiers, clock management, memory, interface circuits, and various signal processing circuits.

An image sensor is a type of semiconductor device that detects and records an image by converting the variable attenuation of light waves or electromagnetic radiation into electric signals. An image sensor can be implemented with semiconductor charge-coupled devices (CCD) and active pixel sensors in complementary metal-oxide-semiconductor (CMOS) or N-type metal-oxide-semiconductor (NMOS) technologies with applications in digital cameras, video recorders, medical imaging equipment, night vision equipment, thermal imaging devices, radar, sonar, and other image detecting devices.

The light source is typically focused onto a flat or planar image sensor surface through one or more optical lenses, e.g., up to four lenses. The optical focusing lenses add cost, complexity, and height to the semiconductor package. Even with optical lenses, the focus is often better in the center region and less on the edges of the image sensor. Image sensors are continually driving towards higher resolution, faster focus times, better focus depth, lower profile, and lower cost.

Figure 1A:
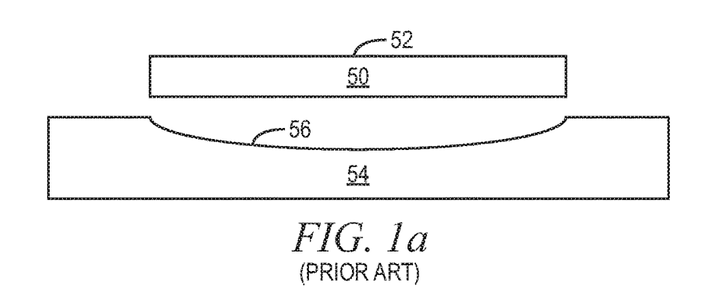
FIGS. 1a-1b illustrate a known image sensor conforming to a curved surface of a substrate.
Figure 1B:
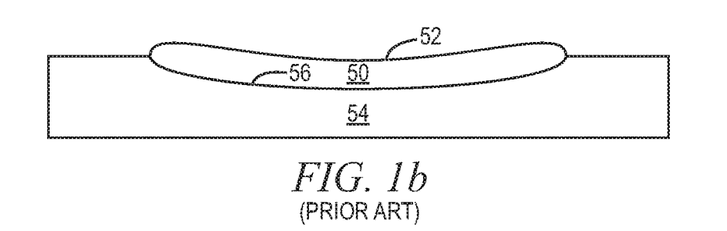

One approach to reducing the number of optical focusing lenses or eliminating the need for optical lenses is to make the image sensor with a curved surface. FIG. 1a shows a known image sensor die 50 with active imaging surface 52 disposed over substrate 54 having a curved surface 56. Image sensor die 50 is attached to curved surface 56 of substrate 54 with an epoxy. Image sensor die 50 conforms to curved surface 56 with application of pressure and heat. The epoxy is cured under pressure leaving image sensor die 50 molded to surface 56 a curved form factor, as shown in FIG. 1b. Image sensor die 50 in FIG. 1b is difficult to manufacture in high volume due in part to the curved nature of substrate 54, the curing process under pressure for the epoxy, the need to angle interconnecting bond wires, and lack of economies of scale. The process of FIGS. 1a-1b is high cost and not amenable with batch processing or mass production.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer may contain active and passive electrical components and optical devices, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions. The optical device detects and records an image by converting the variable attenuation of light waves or electromagnetic radiation into electric signals.

Back-end manufacturing refers to cutting or singulating the finished wafer into the individual semiconductor die and packaging the semiconductor die for structural support, electrical interconnect, and environmental isolation. The wafer is singulated using plasma etching, laser cutting tool, or saw blade along non-functional regions of the wafer called saw streets or scribes. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2A:
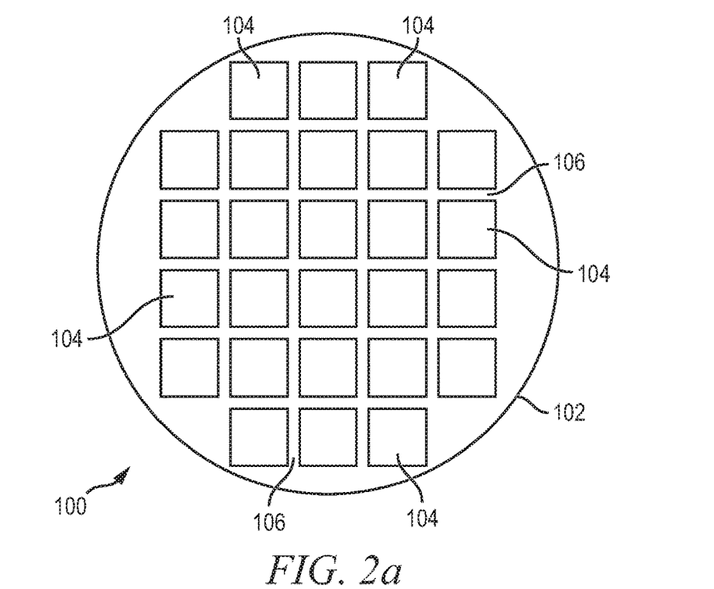
FIGS. 2a-2b illustrate a semiconductor wafer with a plurality of semiconductor die separated by a saw street.

FIG. 2a shows semiconductor wafer 100 with a base substrate material 102, such as silicon, germanium, aluminum phosphide, aluminum arsenide, gallium arsenide, gallium nitride, indium phosphide, silicon carbide, or other bulk semiconductor material for structural support. A plurality of semiconductor die 104 is formed on wafer 100 separated by a non-active, inter-die wafer area or saw street 106, as described above. Saw street 106 provides cutting areas to singulate semiconductor wafer 100 into individual semiconductor die 104. In one embodiment, semiconductor wafer 100 has a width or diameter of 100-450 millimeters (mm) and thickness of 50-100 micrometers (μm) or 15-250 μm.

Figure 2B:
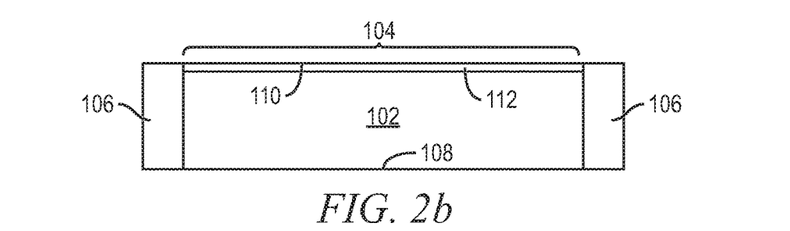

FIG. 2b shows a cross-sectional view of a portion of semiconductor wafer 100. Each semiconductor die 104 has a back or non-active surface 108 and an active surface or region 110 containing an image sensor area 112 implemented as CCD or active pixel sensors in CMOS or NMOS. Active surface 110 with image sensor area 112 is a flat or planar surface in FIG. 2b.

Figure 3A:
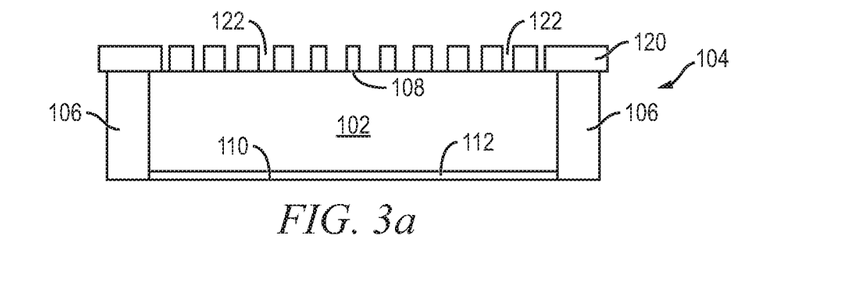
FIGS. 3a-3j illustrate a process of forming a concave surface image sensor area on a semiconductor die.
Figure 3B:
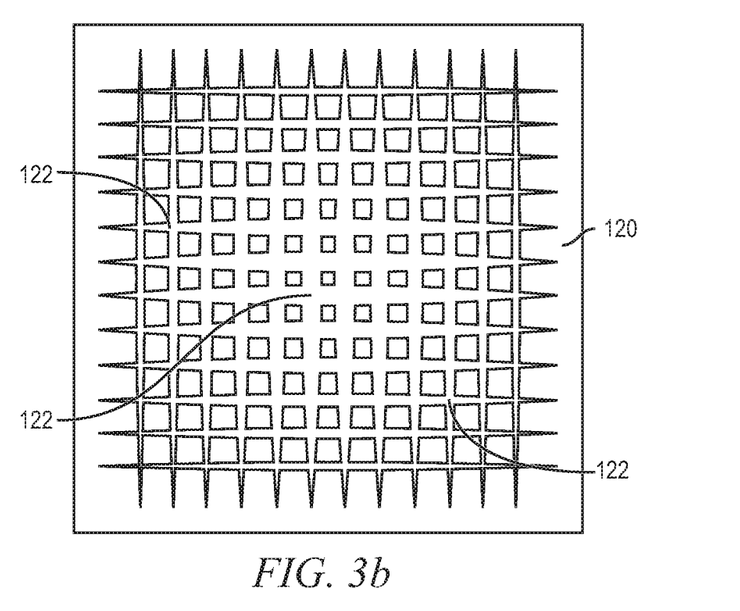

FIGS. 3a-3j illustrate a process of forming a concave surface image sensor area on semiconductor die 104. In FIG. 3a, a masking layer 120 is formed over back surface 108 of each semiconductor die 104 while in the wafer form of FIG. 2a. Masking layer 120 can be made with photoresist or patterned oxide layer having openings 122 of varying width. The width of openings 122 is larger in a center region of masking layer 120 and smaller toward the edges of masking layer 120 over each semiconductor die 104. The variable width of openings 122 in masking layer 120 exposes a larger area in the center region base substrate material 102 and exposes a decreasing area toward the edges of the base substrate material. FIG. 3b shows a top view of masking layer 120 with openings 122 of varying width disposed over base substrate material 102.

Figure 3C:
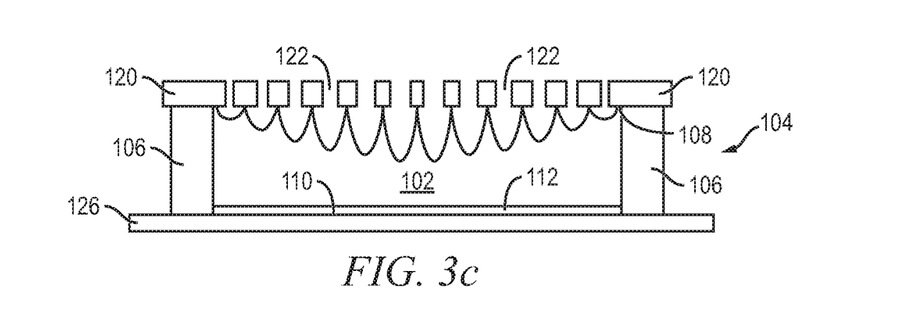
Figure 3D:
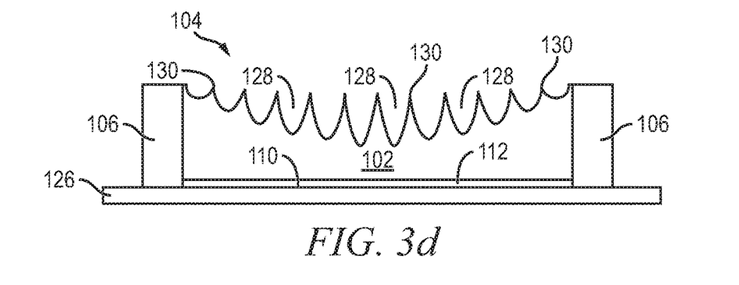

In FIG. 3c, semiconductor wafer 100 with masking layer 120 is mounted to film frame or backing tape 126. A plasma etching process is applied through openings 122 in masking layer 120 to remove a portion of back surface 108 of each semiconductor die 104. In one embodiment, the plasma process uses a plasma die singulation tool. The plasma etching removes more base substrate material 102 in the wider openings 122 in the center region of semiconductor die 104 and less base substrate material in the smaller openings 122 toward the edges of the semiconductor die. A higher volume of gas passes through the larger openings 122 in the center region of masking layer 120, resulting in a higher degree of ion exposure and deeper etching in the center region of base substrate material 102. A lower volume of gas passes through the smaller openings 122 toward the edges of masking layer 120, resulting in less ion exposure and shallower etching toward the edges of base substrate material 102. Masking layer 120 is removed by in-situ ashing in FIG. 3d leaving deeper trenches 128 in the center region of base substrate material 102 and shallower trenches 128 toward the edges of the base substrate material, corresponding to the varying width openings 122. Trenches 128 are separated by peaks 130 of base substrate material 102 remaining after the plasma etching process through openings 122 and aligned with the solid portions of masking layer 120, i.e., between openings 122. Alternatively, trenches 128 can be formed by laser direct ablation (LDA) or other wet or dry chemical etching process.

Figure 3E:
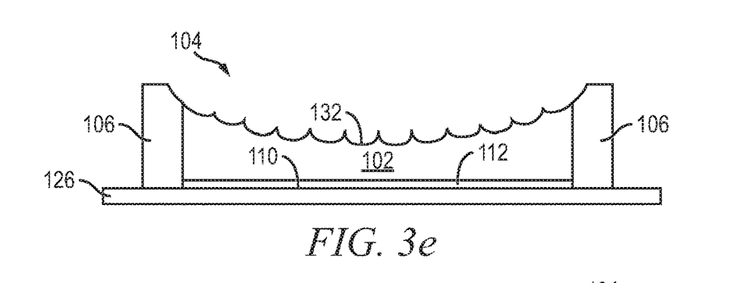
Figure 3F:
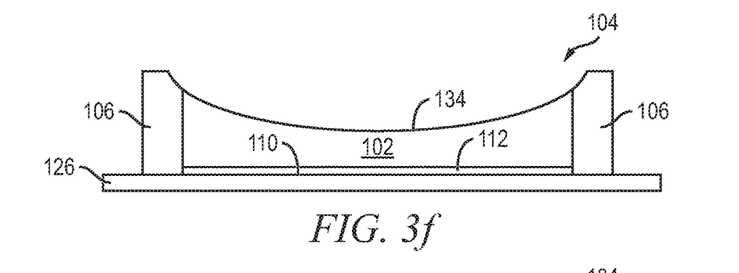

In FIG. 3e, the plasma etching and in-situ ashing processes continue with lower intensity and without masking layer 120 to smooth out peaks 130 of base substrate material 102. Surface 132 of base substrate material 102 has reduced peaks and is beginning to exhibit a curved shape. Alternatively, a wet or dry chemical etch or LDA can be used to remove peaks 130. FIG. 3f shows surface 134 of base substrate material 102 with the peaks substantially removed and exhibiting a generally curved or concave shape. The plasma etching and in-situ ashing process on the back side of semiconductor die 104 is complete. The thickness of base substrate material 102 at the low point of the curved surface 134 is 20-50 μm.

Figure 3G:
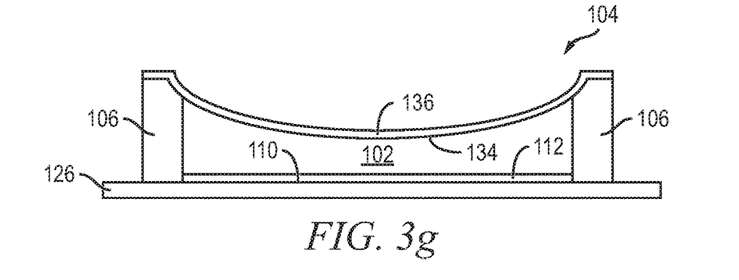

In FIG. 3g, an optional metal layer 136 is conformally applied over curved or concave surface 134 using PVD, CVD, electrolytic plating, electroless plating process, or other suitable metal deposition process. In one embodiment, metal layer 136 can be one or more layers of aluminum (Al), copper (Cu), tin (Sn), nickel (Ni), silver (Ag), titanium (Ti), titanium tungsten (TiW), or alloy or combination thereof. Metal 136 can be solder, eutectic Sn/Pb, high-lead solder, or lead-free solder. Alternatively, an adhesive, such as an epoxy, is conformally applied to concave surface 134. Surface 134 and metal layer 136 have curved or concave shape.

Figure 3H:
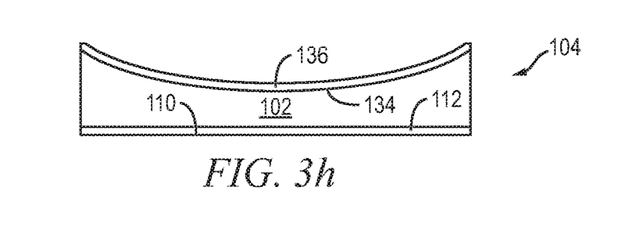

In FIG. 3h, semiconductor wafer 100 is singulated through saw street 106 into individual semiconductor die 104 using plasma etching. Film frame 126 is removed. Plasma etching has advantages of removing base substrate material 102 to form precision surfaces, while retaining the structure and integrity of the base substrate material. The individual semiconductor die 104 can be inspected and electrically tested for identification of known good die post singulation.

Figure 3I:
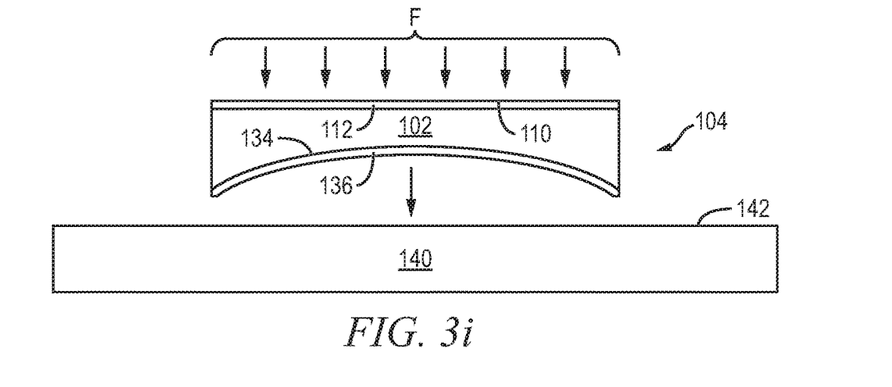

In FIG. 3i, semiconductor die 104 is inverted with the curved or concave surface 134 and metal layer 136 oriented toward substrate 140. The flat or planar active surface 110 is oriented away from substrate 140. Substrate 140 includes a flat or planar surface 142 and contains sacrificial base material such as silicon, polymer, beryllium oxide, glass, or other suitable low-cost, rigid material for structural support. A force F is applied to planar active surface 110 of semiconductor die 104 with an elevated temperature of 260° C. or higher to press the concave surface 134 and metal layer 136 against planar surface 142 of substrate 140. Metal layer 136 reflows above 260° C. to provide flexibility and base substrate material 102 exhibits a pliable property for asserting movement, bending, or flexing of the base substrate material. Once metal layer 136 is reflowed, it should not reflow again when the semiconductor package is mounted to the end product. As the concave surface 134 and metal layer 136 contact planar surface 142 of substrate 140, the force F asserts movement or flexing of base substrate material 102 to cause curved or concave surface 134 of base material 102 to switch or change orientation of surface 134 and metal layer 136 to a planar surface and active surface 110 to a concave surface. The surface tension of metal layer 136 assists with drawing the center of base substrate material 102 to planar surface 142 of substrate 140.

Figure 3J:
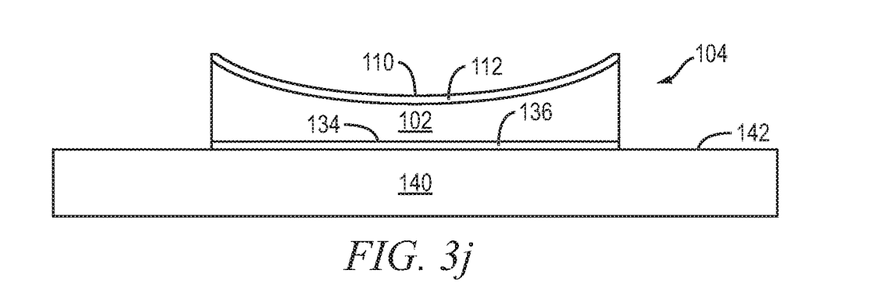

FIG. 3j shows the resulting movement, bending, or flexing of base substrate material 102 and change of orientation to surface 134 and metal layer 136 exhibiting a flat or planar against substrate 140 and active surface 110 with image sensor area 112 now having a curved or concave surface. The force F pressing surface 134 and metal layer 136 against planar surface 142 of substrate 140, as well as the surface tension of metal layer 136, causes the movement or flexing of base substrate material 102 and change of orientation of planar active surface 110 in FIG. 3i to the concave active surface 110 in FIG. 3j. Vibration can also be used to enhance flexing of base substrate material 102. Metal layer 136 helps planarize and strengthen planar surface 134 after the change in orientation of base substrate material 102. After the movement or flexing of base substrate material 102 under pressure and temperature, surface 134 and metal layer 136 is a planar surface and image sensor area 112 in active surface 110 now has the curved or concave shape. Base substrate material 102 with the curved or concave image sensor area 112 can be ultraviolet cured.

Figure 4:
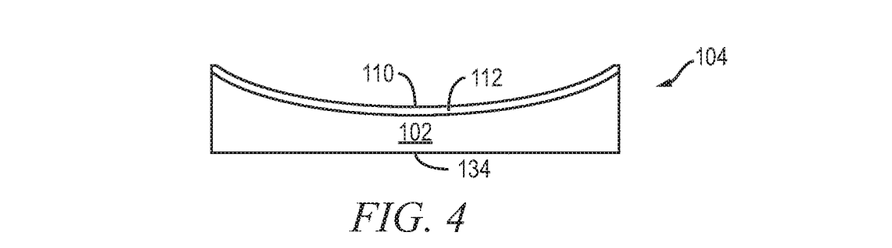
FIG. 4 illustrates the semiconductor die with a concave surface image sensor area.

FIG. 4 shows semiconductor die 104 removed from substrate 140 by chemical etching, mechanical peeling, chemical mechanical planarization (CMP), mechanical grinding, thermal bake, UV light, laser scanning, or wet stripping. Image sensor area 112 in active surface 110 exhibits the curved or concave shape to reduce or eliminate the need for optical lenses. Metal layer 136 is optionally removed. The process described in FIGS. 3a-3j, using plasma etching to form a concave surface in the back side of the base substrate material and then asserting movement, bending, or flexing of base substrate material 102 to change orientation of the base substrate material from a planar image sensor area to a concave image sensor area, provides a low cost, repeatable solution manufactureable in wafer form to mass produce a concave curved image sensor on a semiconductor die. The light source focuses onto a curved or concave image sensor area 112, without or with a reduced number of optical lenses, to provide higher resolution, faster focus times, better focus depth, lower profile, and lower cost.

Figure 5:
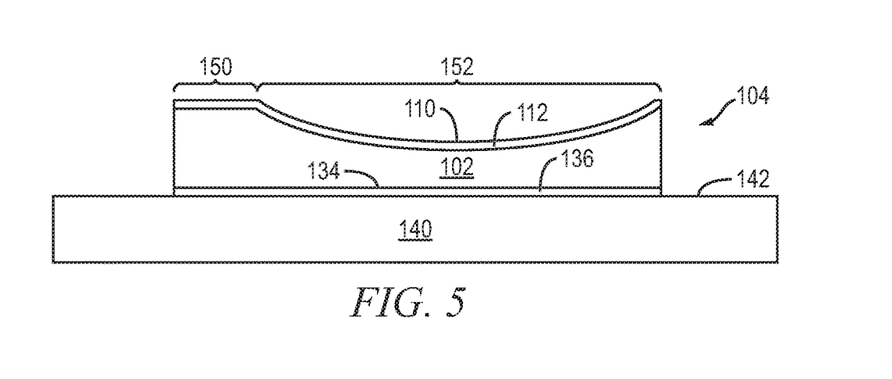
FIG. 5 illustrates the semiconductor die with an image sensor area having a partial concave surface and partial planar surface.

FIG. 5 shows an alternate embodiment with the concave shape formed in a portion of active surface 110. Area 150 of active surface 110 remains a flat or planar surface and area 152 of the active surface is formed with the curved or concave shape, as described in FIGS. 3a-3j.

Figure 6A:
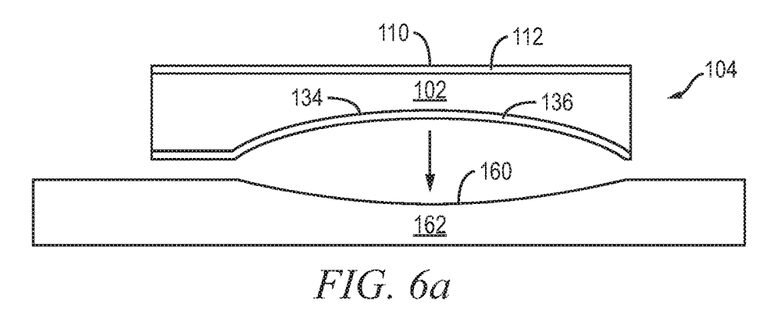
FIGS. 6a-6b illustrate a process of forming the concave surface image sensor area on substrate having a curved surface.
Figure 6B:
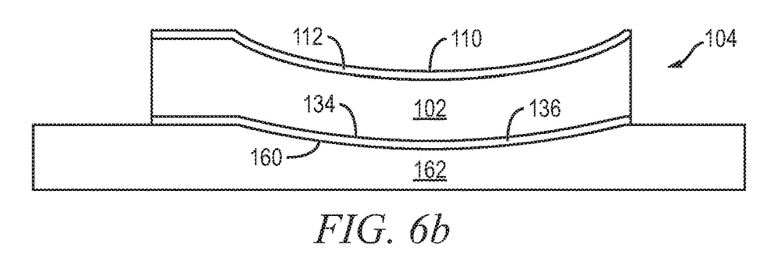

FIG. 6a shows an alternate embodiment with a curved shape 160 formed in substrate 162. Semiconductor die 104 is positioned over substrate 162 with concave metal layer 136 aligned with curved shape 160, similar to FIG. 3i. Curved shape 160 assists with alignment of semiconductor die over substrate 162. A force F is applied to planar active surface 110 of semiconductor die 104 with an elevated temperature of 260° C. or higher to press the concave surface 134 and metal layer 136 against curved surface 160 of substrate 162. Metal layer 136 reflows above 260° C. to provide flexibility and base substrate material 102 exhibits a pliable property for asserting movement, bending, or flexing of the base substrate material. Once metal layer 136 is reflowed, it should not reflow again when the semiconductor package is mounted to the end product. As the concave surface 134 and metal layer 136 contact curved surface 160 of substrate 162, the force F causes movement or flexing of base substrate material 102 and change of orientation of surface 134 and metal layer 136 to a convex shape and active surface 110 to a concave shape, as shown in FIG. 6b.

Figure 7A:
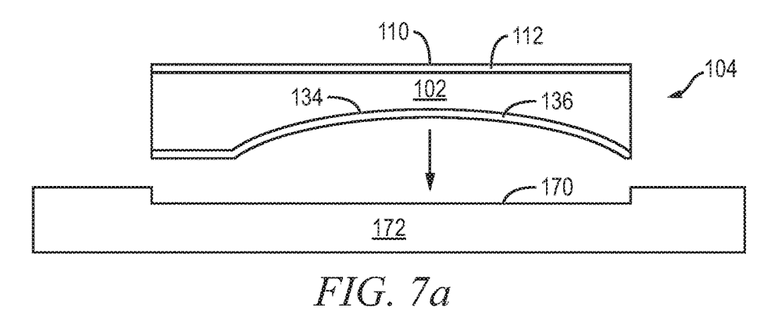
FIGS. 7a-7b illustrate a process of forming the concave surface image sensor area on substrate having a recessed surface.
Figure 7B:
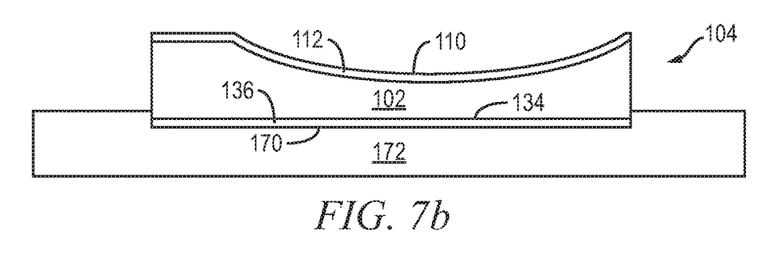

FIG. 7a shows an alternate embodiment with a recessed surface 170 formed in substrate 172. Semiconductor die 104 is positioned over substrate 172 and aligned with recessed surface 170 in substrate 172, similar to FIG. 3i. A force F is applied to planar active surface 110 of semiconductor die 104 with an elevated temperature of 260° C. or higher to press the concave surface 134 and metal layer 136 against recessed surface 170 of substrate 172. Metal layer 136 reflows above 260° C. to provide flexibility and base substrate material 102 exhibits a pliable property for asserting movement or flexing of the base substrate material. Once metal layer 136 is reflowed, it should not reflow again when the semiconductor package is mounted to the end product. As the concave surface 134 and metal layer 136 contact recessed surface 170 of substrate 172, the force F causes movement, bending, or flexing of base substrate material 102 in FIG. 7b and change of orientation of surface 134 and metal layer 136 to a planar surface and active surface 110 to a curved or concave shape.

While one or more embodiments have been illustrated and described in detail, the skilled artisan will appreciate that modifications and adaptations to those embodiments may be made without departing from the scope of the present disclosure.

What is claimed:

1. A method of making a semiconductor device, comprising:
   providing a semiconductor die including a base semiconductor material comprising a first surface and a second surface opposite the first surface, wherein the second surface includes an image sensor area;
   removing a portion of the first surface of the base semiconductor material to form a first curved surface;
   disposing the semiconductor die on a substrate with the first curved surface oriented toward the substrate; and
   asserting movement of the base semiconductor material by external force to change orientation of the second surface with the image sensor area into a second curved surface.

2. The method of claim 1, further including utilizing plasma etching to remove the portion of the first surface of the base semiconductor material.

3. The method of claim 1, further including disposing a masking layer over the first surface of the base semiconductor material, wherein the masking layer includes openings of varying width.

4. The method of claim 1, further including:
   providing a substrate;
   disposing the semiconductor die over the substrate with the first curved surface oriented toward the substrate; and
   applying pressure and temperature to assert movement of the base semiconductor material to change orientation of the second surface with the image sensor area into the second curved surface.

5. The method of claim 4, wherein the substrate includes a curved surface or recessed surface.

6. The method of claim 1, further including forming a metal layer over the first curved surface of the base semiconductor material.

7. A method of making a semiconductor device, comprising:
   providing a semiconductor die including a base substrate material comprising a first surface and a second surface opposite the first surface;
   removing a portion of the first surface of the base substrate material to form a first curved surface; and
   asserting movement of the base substrate material by external force to change orientation of the second surface into a second curved surface.

8. The method of claim 7, wherein the second surface of the base substrate material includes an image sensor area.

9. The method of claim 7, further including utilizing plasma etching to remove the portion of the first surface of the base substrate material.

10. The method of claim 7, further including disposing a masking layer over the first surface of the base substrate material, wherein the masking layer includes openings of varying width.

11. The method of claim 10, wherein the openings of the masking layer are larger in a center region of the semiconductor die and smaller toward edges of the semiconductor die.

12. The method of claim 7, further including:
providing a substrate;
disposing the semiconductor die over the substrate with the first curved surface oriented toward the substrate; and
applying pressure and temperature to assert movement of the base substrate material to change orientation of the second surface into the second curved surface.

13. The method of claim 12, wherein the substrate includes a curved surface or recessed surface.

14. A method of making a semiconductor device, comprising:
providing a semiconductor die including a base substrate material;
removing a portion of the base substrate material to form a first curved surface; and
asserting movement of the base substrate material by external force to change orientation into a second curved surface.

15. The method of claim 14, wherein the base substrate material includes an image sensor area.

16. The method of claim 14, further including utilizing plasma etching to remove the portion of the base substrate material.

17. The method of claim 14, further including disposing a masking layer over the base substrate material, wherein the masking layer includes openings of varying width.

18. The method of claim 17, wherein the openings of the masking layer are larger in a center region of the semiconductor die and smaller toward edges of the semiconductor die.

19. The method of claim 14, further including:
providing a substrate;
disposing the semiconductor die over the substrate with the first curved surface oriented toward the substrate; and
applying pressure and temperature to assert movement of the base substrate material to change orientation into the second curved surface.

20. The method of claim 19, wherein the substrate includes a curved surface or recessed surface.

* * * * *